United States Patent
Chen et al.

(10) Patent No.: US 8,189,396 B2
(45) Date of Patent: May 29, 2012

(54) WORD LINE DRIVER IN A HIERARCHICAL NOR FLASH MEMORY

(75) Inventors: Chung-Zen Chen, Hsinchu (TW); Yang-Chieh Lin, Tainan (TW); Chung-Shan Kuo, Shulin (TW)

(73) Assignee: Mosaid Technologies Incorporated, Ottawa (CA)

( * ) Notice: Subject to any disclaimer, the term of this patent is extended or adjusted under 35 U.S.C. 154(b) by 875 days.

(21) Appl. No.: 11/610,573

(22) Filed: Dec. 14, 2006

(65) Prior Publication Data

US 2008/0144389 A1    Jun. 19, 2008

(51) Int. Cl.
*G11C 16/08* (2006.01)

(52) U.S. Cl. ......... 365/185.23; 365/185.02; 365/185.27; 365/185.29; 365/185.12; 365/185.13; 365/185.11

(58) Field of Classification Search ............. 365/185.12, 365/185.13, 185.11, 185.23, 185.02, 185.27, 365/185.29
See application file for complete search history.

(56) References Cited

U.S. PATENT DOCUMENTS

| | | | |
|---|---|---|---|
| 5,282,175 A * | 1/1994 | Fujita et al. | 365/230.06 |
| 5,506,816 A * | 4/1996 | Hirose et al. | 365/230.06 |
| 5,581,508 A | 12/1996 | Sasaki et al. | |
| 5,793,679 A | 8/1998 | Caser et al. | |
| 5,875,149 A | 2/1999 | Oh et al. | |
| 5,880,995 A * | 3/1999 | Kobatake | 365/185.23 |
| 6,011,746 A | 1/2000 | Oh | |
| 6,125,076 A | 9/2000 | Ishikawa | |
| 6,233,198 B1 | 5/2001 | Choi | |
| 6,347,052 B1 | 2/2002 | Akaogi et al. | |
| 6,515,911 B2 | 2/2003 | Campardo et al. | |
| 6,665,228 B2 * | 12/2003 | Benedix et al. | 365/230.03 |
| 6,888,340 B1 | 5/2005 | Chen | |
| 2005/0207236 A1 | 9/2005 | Yamazoe et al. | |

OTHER PUBLICATIONS

Akira Umezawa et al., "A 5-V-Only Operation 0.6-μm Flash EEPROM with Row Decoder Scheme in Triple-Well Structure," IEEE Journal of Solid-State Circuits, vol. 27, No. 11, Nov. 1992.

* cited by examiner

*Primary Examiner* — Andrew Q Tran
(74) *Attorney, Agent, or Firm* — Harvey Auerback

(57) ABSTRACT

A memory device of the non-volatile type including a memory array having a plurality of memory cells organized as sectors, each sector having a main word line associated with a plurality of local word lines, each local word line coupled to the main word line by a respective local word line driver circuit, each of the local word line driver circuits consisting of a first MOS transistor coupled between the respective main word line and a respective local word line and a second MOS transistor coupled between the respective local word line and a first biasing terminal.

17 Claims, 8 Drawing Sheets

WORD LINE DRIVER IN A HIERARCHICAL NOR FLASH MEMORY

FIELD OF THE INVENTION

The present invention relates to semiconductor memory designs, and more particularly to improved word line driver designs for flash memory.

BACKGROUND OF THE INVENTION

The memory matrix architecture most widely utilized in the construction of semiconductor integrated, non-volatile memory devices is the NOR type. In this type of architecture, memory cells belonging to one row have their gate terminals in common, while memory cells belonging to one column have their drain terminals in common. The source terminals are, on the other hand, shared by all the cells of one sector. A portion of a NOR matrix, reprinted from U.S. Pat. No. 6,515,911, the entirety of which is incorporated by reference herein, is shown in FIG. 1.

Each memory location is identified by a given row and given column and found at the intersection thereof. Each memory cell comprises a floating-gate transistor which has drain and source conduction terminals. As known in the art, the source, drain and gate terminals are biased accordingly to perform read, program and erase operations.

A prerequisite of non-volatile memories of the flash EEPROM type is that the information stored therein should be erased by groups or packages of bits. The erase operation is the only operation that involves biasing of the source terminal, and since all the cells have this terminal in common, they can be written into and read from in an independent manner but must be erased simultaneously.

Particularly with flash memories, the erase operation is performed by sectors, in the sense that all the cells that run to the same source line must be erased simultaneously. Within a non-volatile memory matrix, the sectors can be organized either into rows or columns. In a row type of organization, the size of a sector is given by the number of rows that it contains. The architecture of the storage device is designed to fit the number and size of the sectors in order to optimize the circuit area consumption, as well as the device performance and reliability.

A single bit line is not shared by all of the sectors because of a problem known as "drain stress." Therefore, each sector is arranged to include a specific group of columns referred to as the "local bit lines." Local bit lines are individually connected, via a pass transistor, to a main metallization connection referred to as the "main bit line." Each sector is assigned a local group of pass transistors which are only turned "on" in the addressed sector, so that the cells of the other sectors need not be affected by drain stress.

Shown schematically in FIG. 2, also reprinted from the '911 patent, is a conventional architecture for a non-volatile memory matrix wherein the sectors are organized into rows. The rows of the memory matrix are physically in the form of polysilicon strips interconnecting all the gate terminals of the cells in one row. The architecture includes a plurality of sectors each having an associated row decoder. A global column decoder is also provided. This architecture consumes a lot of circuit space because it entails the provision of a row decoder for each sector, and of local column decoders to avoid the drain stress phenomenon.

Another prior art architecture shown in FIG. 3, also reprinted from the '911 patent, organizes the non-volatile memory matrix into columns. In this case, the rows are shared in common by all sectors, and the sector size is determined by the number of columns. This architecture keeps the parasitic capacitance of each bit line relatively low, which is beneficial to the circuit portion involved in reading the memory contents. In addition, row decoding is shared by several sectors, which affords savings in circuit space. While being advantageous in several ways, this architecture has a drawback in that each time when a cell is addressed, all the other cells in the same row also are biased and affected by the so-called "gate stress."

In view of the shortcomings of these prior art architectures, the '911 patent proposes embodiments of hierarchical row decode. In one described embodiment, a circuit device is provided capable of carrying out a hierarchical form of row decoding for semiconductor memory devices of the non-volatile type having a matrix of memory cells with sectors organized into columns. Each sector has a specific group of local word lines individually connected to a main word line running through all of the sectors which have rows in common. The '911 patent describes a three transistor structure for carrying out the hierarchical row decoding.

The word line driver design for the row decoders of these NOR architectures has become increasingly more important since the periphery transistors of the driver design cannot shrink proportionately with reductions in the size of the cell dimensions, as the driver transistors must be able to sustain the bias conditions of legacy generations. Therefore, as cell sizes reduce, the word line driver occupies a greater amount of the overall circuit layout area. While there are advantages to hierarchical row decoding schemes such as those proposed in the '911 patent, these schemes consume valuable space. Therefore, improved word line driver designs are desired.

SUMMARY OF THE INVENTION

A non-volatile memory device is provided. The device includes a memory array having a plurality of memory cells organized as sectors, each sector having a main word line associated with a plurality of local word lines, each local word line coupled to the main word line by a respective local word line driver circuit, each of the local word line driver circuits consisting of a first MOS transistor coupled between the respective main word line and a respective local word line and a second MOS transistor coupled between the respective local word line and a first biasing terminal.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

As those in the art will recognize, word line driver circuits are used to boost selected word lines to a desired voltage. Word line driver circuits also provide final decoding of the row or X address of the selected core cell. Typically, each word line has an accompanying word line driver circuit. With improvements in device layout and in process technologies, the core cells in a memory array are laid out at increasingly finer pitches. As word lines are placed closer together, limitations are placed on the size of the word line driver circuits. The word line driver designs described herein provide for reduced word line driver size by limiting the number of operational components within the word line drivers. The exemplary biasing conditions proposed herein illustrate the operability of the designs.

Figure 8:
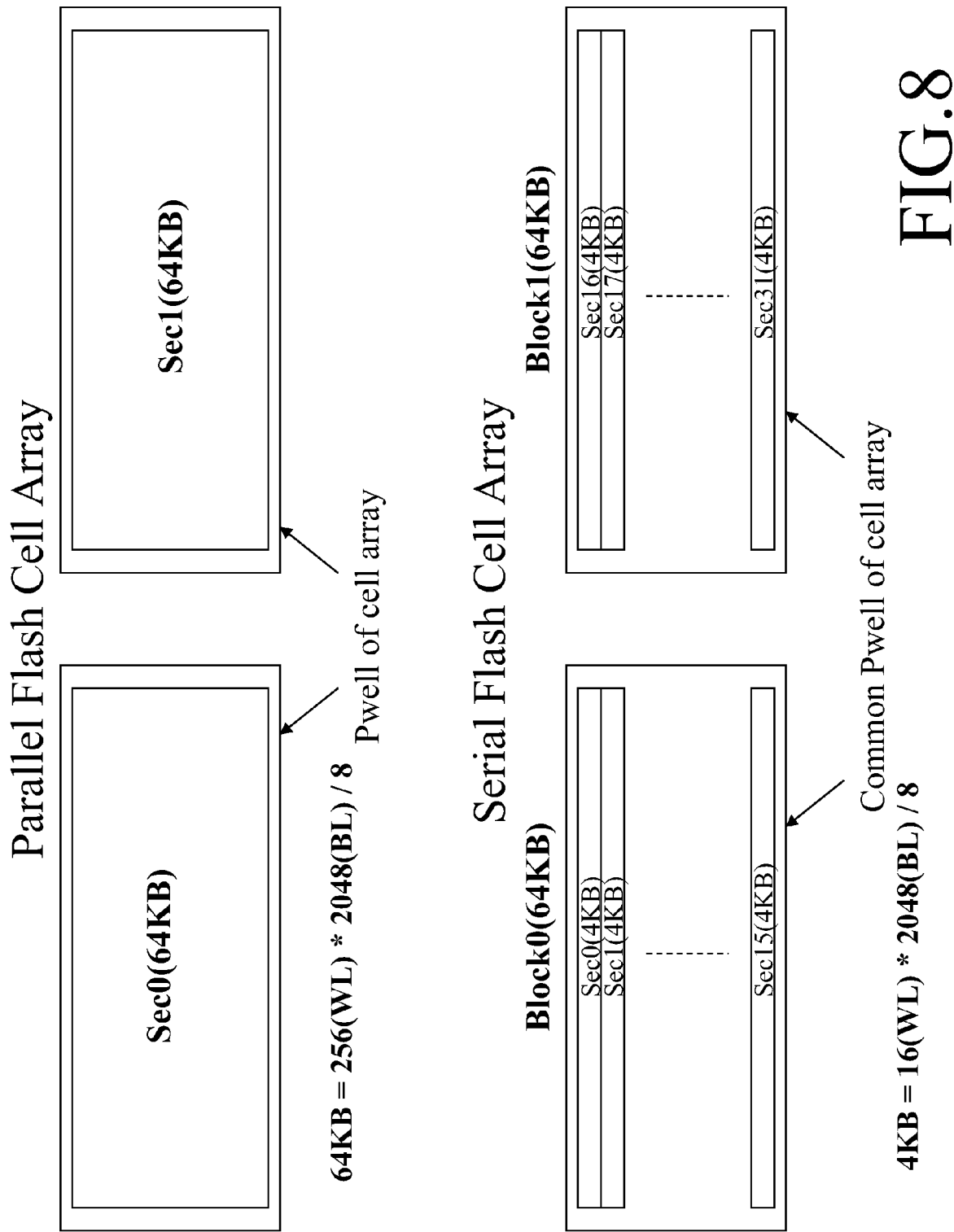
FIG. 8 is a schematic illustration comparing parallel flash cell arrays and serial flash cell arrays.

FIG. 8 is a schematic diagram comparing organizations of flash memories into parallel flash cell arrays and serial flash cell arrays. In parallel flash cell arrays, sectors do not share a common P-well. Sectors are typically broken into 64 KB sections. Erasing is executed by sector. With serial flash cell arrays, the array is structured in blocks of sectors. Each block has 16 sectors, with each sector having 4 KB of memory. Therefore, each block is 64 KB of memory. The sectors of each block share a common P-well but separate blocks do not.

Figure 6:
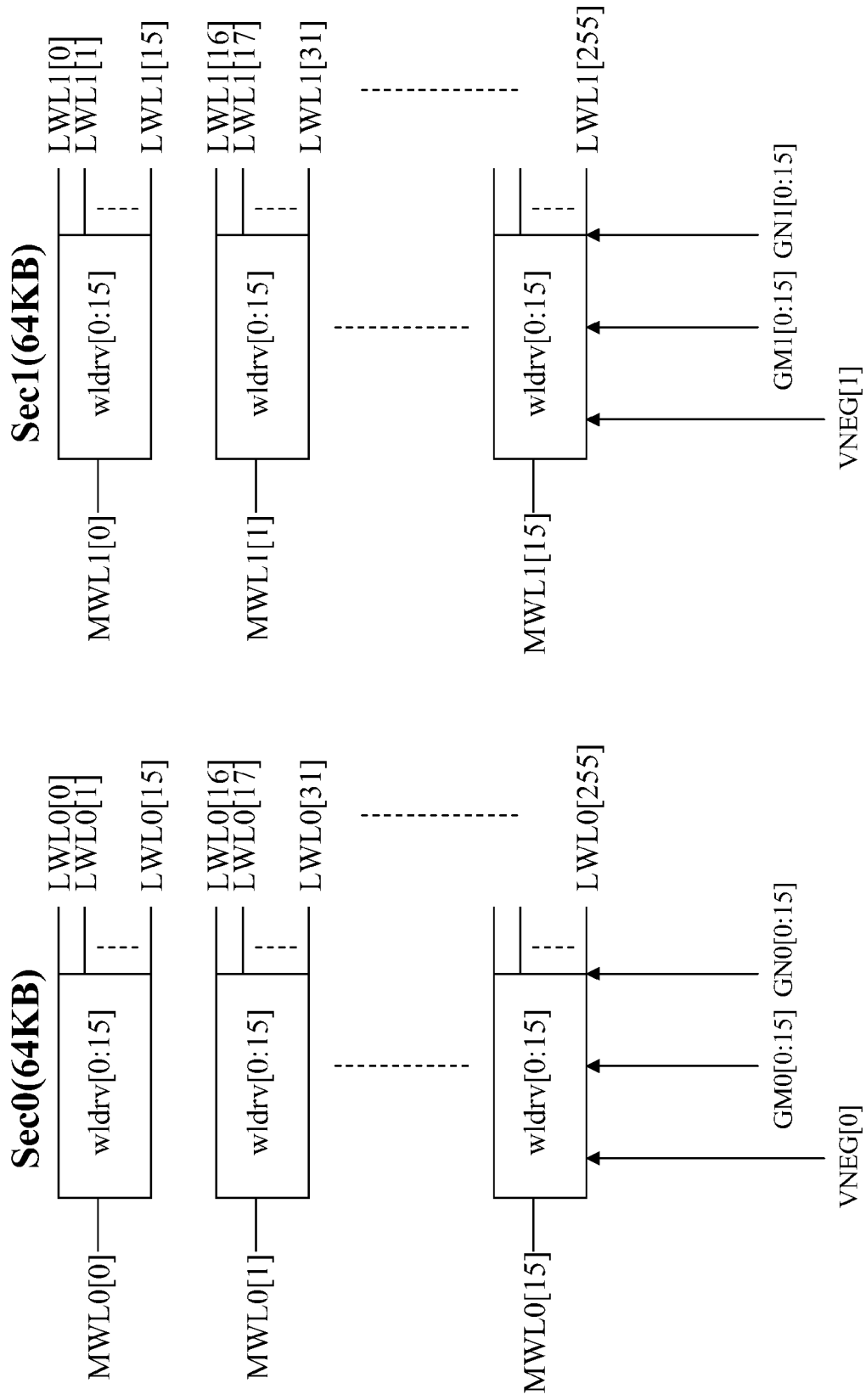
FIG. 6 is a schematic diagram of a parallel flash, non-volatile semiconductor memory device.

FIG. 6 shows the incorporation of the word line driver of the present invention into a parallel flash memory device. Though only two sectors (0,1) are illustrated, it should be understood that a typical parallel flash will include 16 sectors (8 Mb), 32 sectors (16 Mb), 64 sectors (32 Mb), 128 sectors (64 Mb) or 256 sectors (128 Mb). Each sector contains 64 KB of memory biased through 16 main word lines MWLn[0:15]. Each main word line is, in turn, coupled to 16 local word lines LWLn through a respective set of 16 corresponding local word line drivers wldrv[0:15], the details of which are described in detail below. In all, each sector has 256 local word lines LWLn[0:255].

Figure 7:
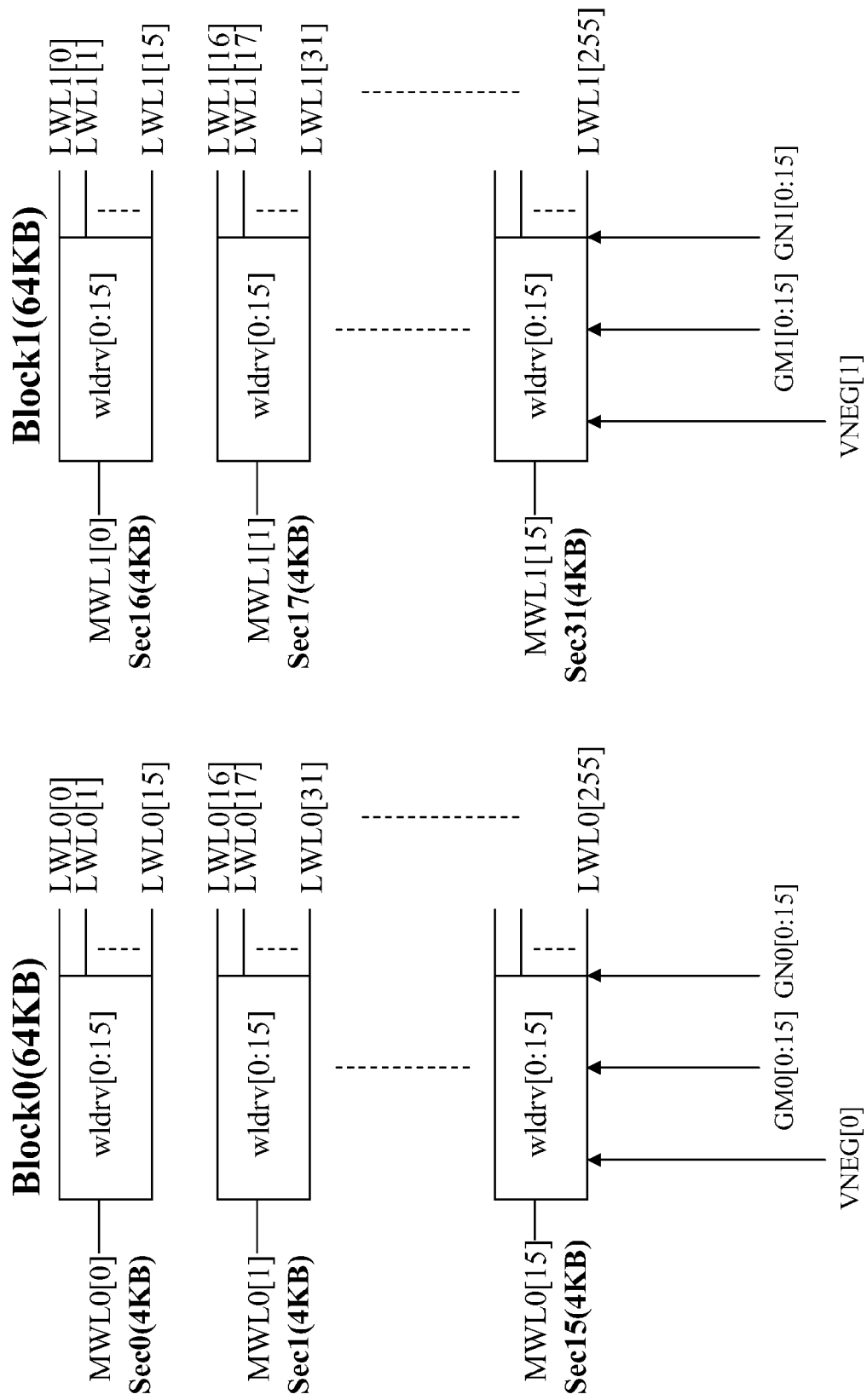
FIG. 7 is a schematic diagram of a serial flash, non volatile semiconductor memory array.

FIG. 7 shows the incorporation of the word line driver of the present invention into a serial flash array, such as a SPI serial flash. Though only two blocks (0,1) are illustrated, the device typically includes 16 blocks of memory. Each block has 64 KB of storage accessed through 16 corresponding main word lines MWLn[0:15] associated with respective sectors of the block. Each sector has 4 KB of memory. Each main word line is, in turn, coupled to 16 local word lines LWLn through a respective set of 16 corresponding local word line drivers wldrv[0:15], the details of which are described below. In all, each block has 256 local word lines LWLn[0:255].

Figure 1:
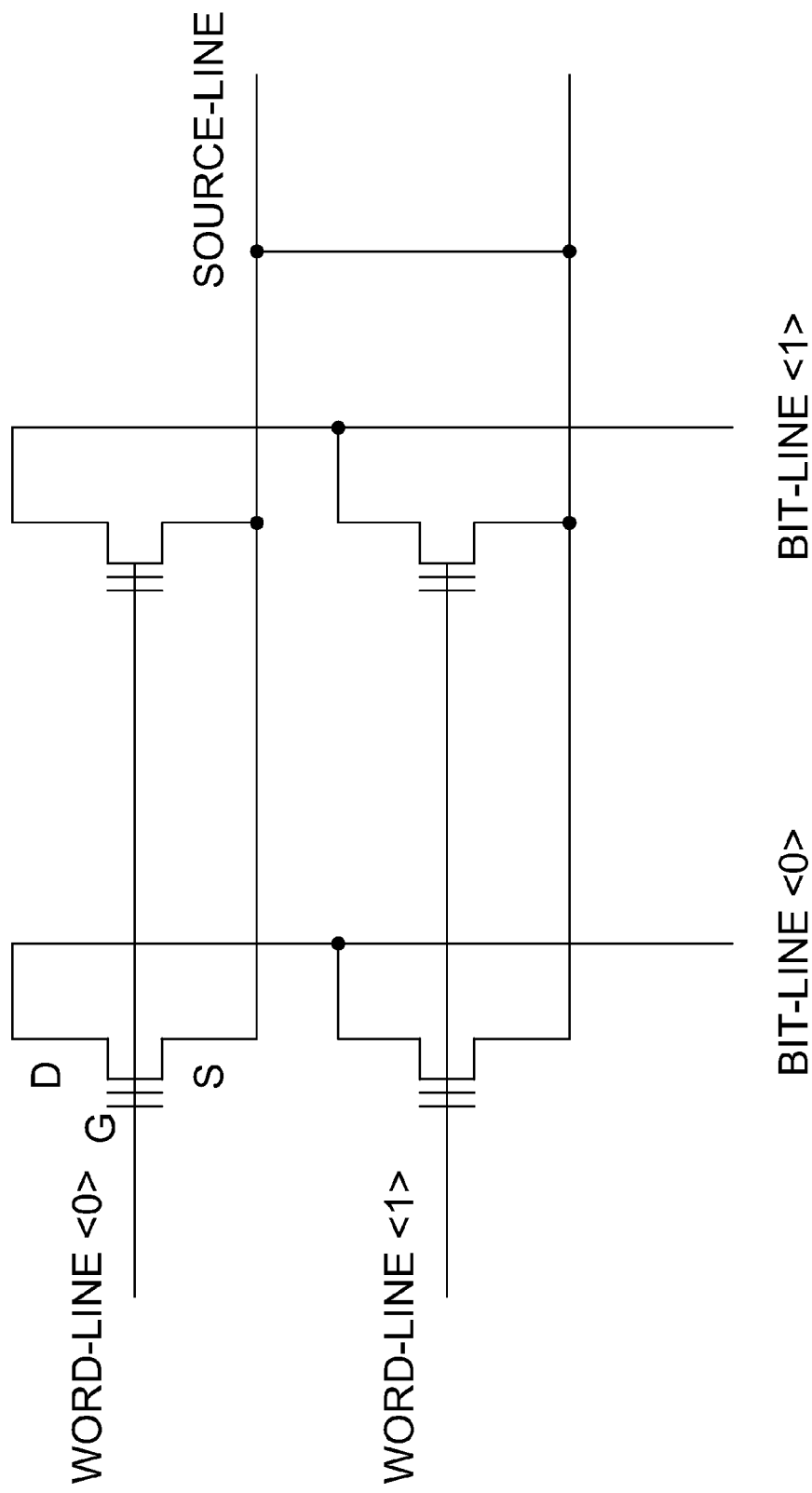
FIG. 1 is a schematic view of a portion of a conventional memory matrix of the NOR type.
Figure 2:
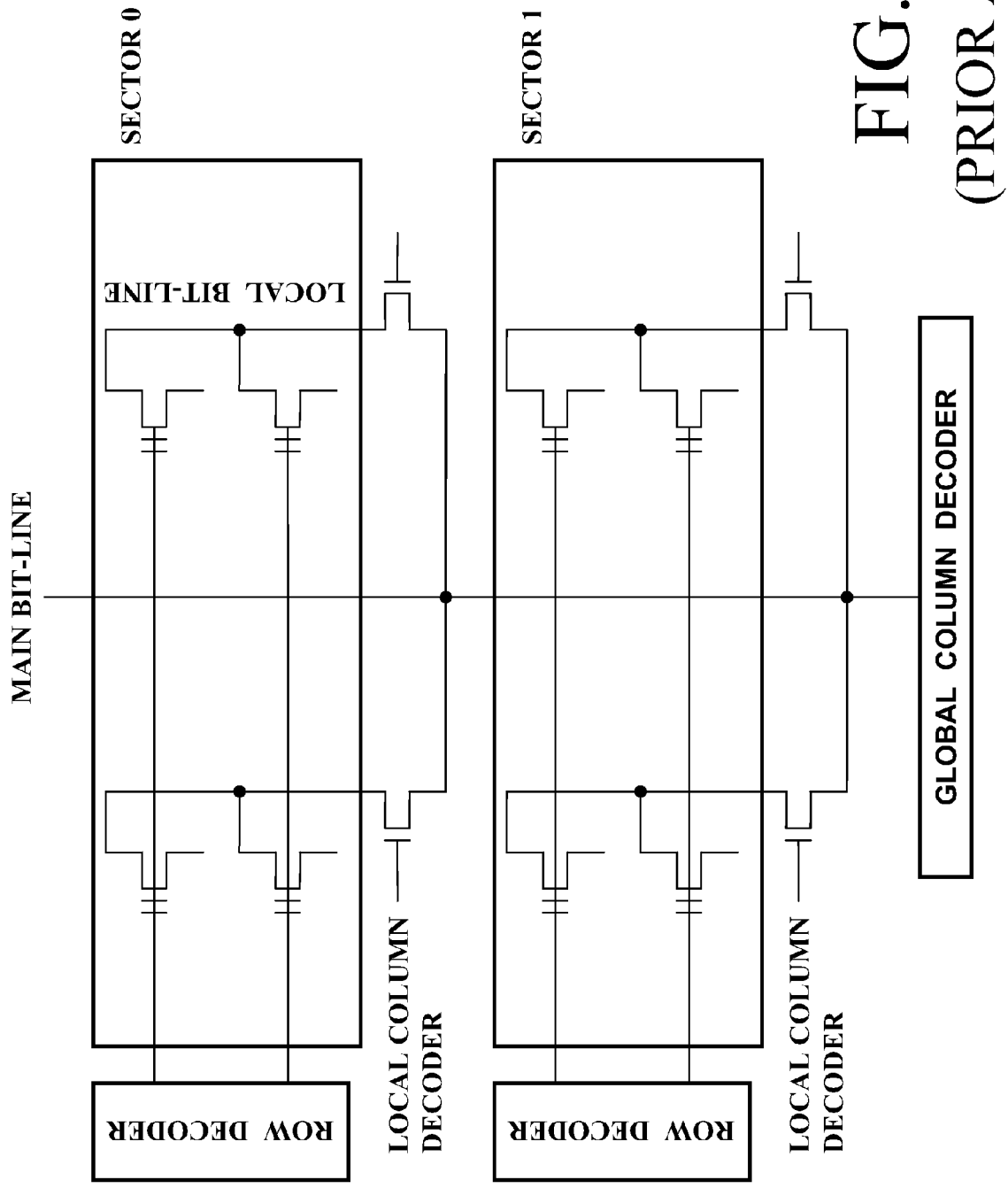
FIG. 2 is a schematic view of a conventional architecture for a non-volatile memory matrix having sectors arranged in row form.
Figure 3:
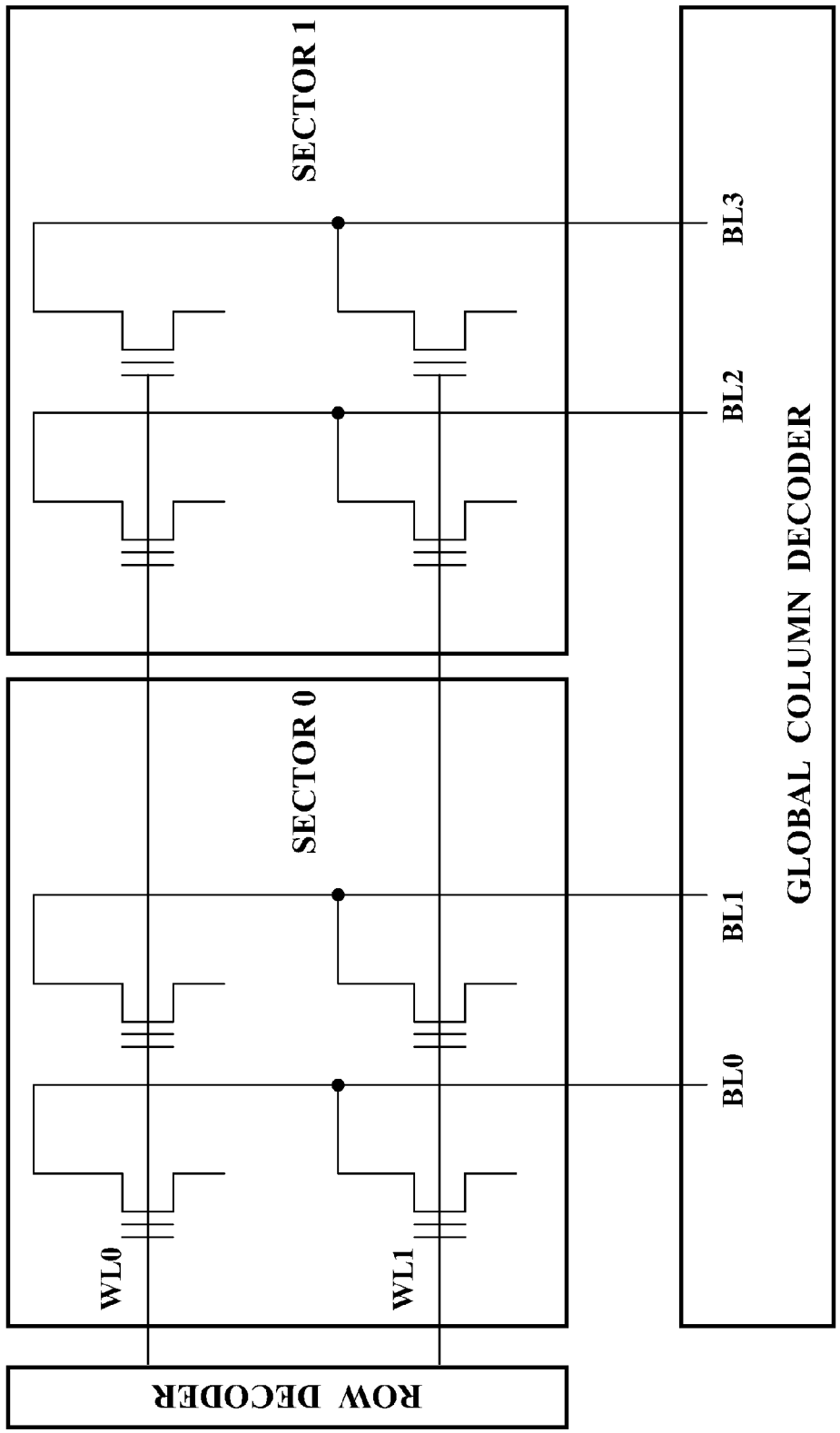
FIG. 3 is a schematic view of a conventional architecture for a non-volatile memory matrix having sectors arranged in column form.
Figures 4, 5:
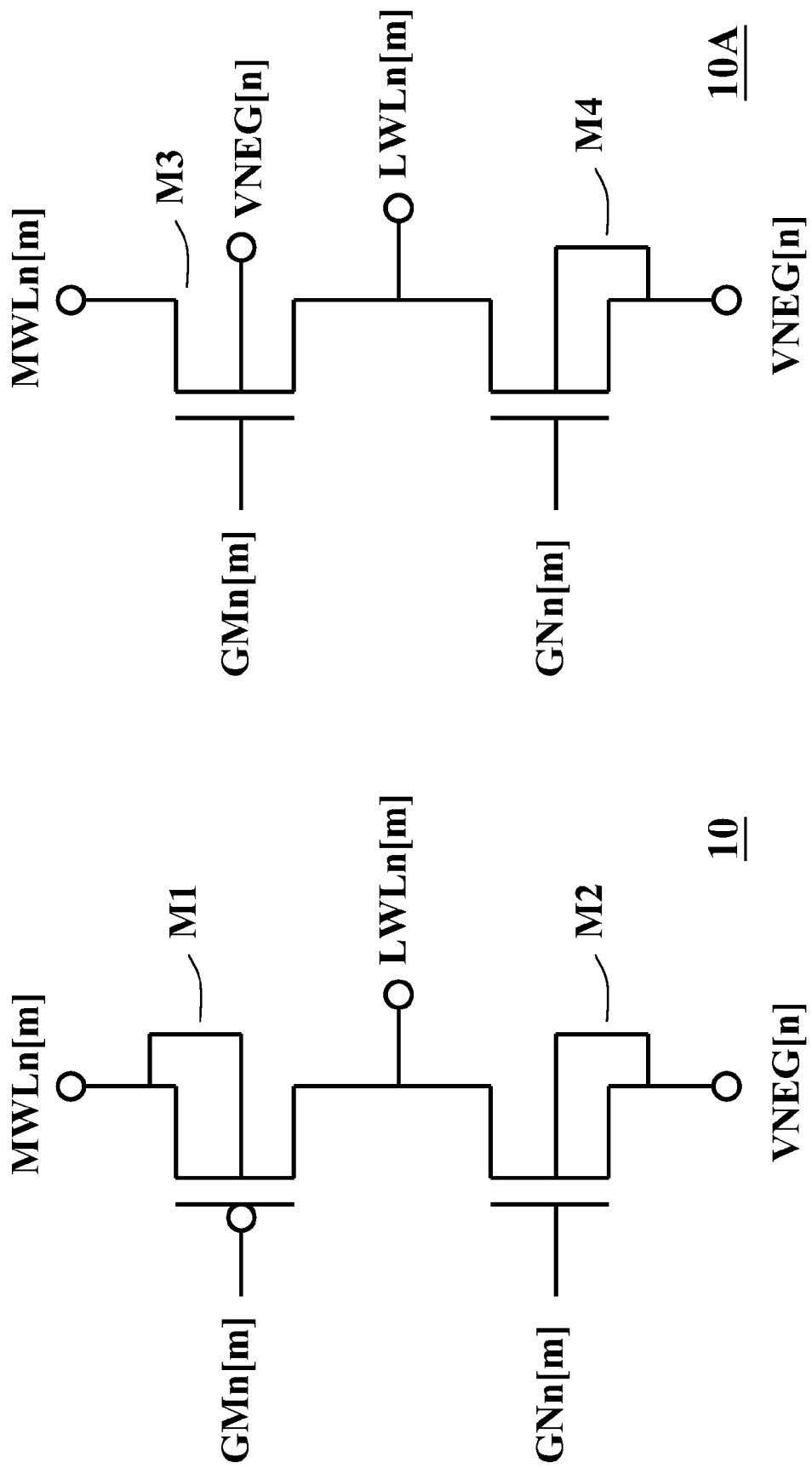
FIG. 4 is a circuit diagram of a first embodiment of an exemplary two-transistor word line driver design.
FIG. 5 is a circuit diagram of a second embodiment of an exemplary two-transistor word line driver design.

FIGS. 4-5 are schematic circuit diagrams of embodiments of two-transistor word line driver designs implemented in a non-volatile, flash NOR memory matrix having sectors arranged in column or other form. More specifically, the two-transistor word line driver is especially adapted for use in connection with a memory matrix structure where each sector has a main word line with a plurality of local word lines within the sector each coupled to the main word line through a respective word line driver 10 (FIG. 4) or 10A (FIG. 5). The description of the local word line drivers 10, 10A provided herein applies to but is not limited to SPI serial flash and to parallel flash.

For NMOS cell designs, the P-well bias is raised to perform erasing. The word line in the selected sector is biased to a negative voltage. With serial flash, when performing sector erase (as opposed to block erase), the de-selected sectors in a selected block suffer erase disturbance from the common P-well bias shared with the cells of the selected sector. The word line driver design is important for reducing this erase disturbance.

Turning to FIG. 4, a first embodiment of a two-transistor word line driver design 10 is shown. As will be readily familiar to those in the art, in embodiments each local word line includes 2048 NOR cells. In this design 10, the word line driver for each local word line comprises, and preferably consists of, two MOS transistors, M1 and M2. A plurality of local word lines share a respective main word line, which is biased by a signal MWLn[m]. Transistor M1 is a PMOS transistor with its source terminal coupled to MVvLn[m]. The drain terminal of PMOS transistor M1 is coupled to the drain terminal of NMOS transistor M2. The drain terminals are coupled to provide a read, program or erase bias LWLn[m] to a respective local word line. The source of NMOS transistor M2 is coupled to bias signal VNEG[n]. The bulk of the NMOS transistor M2 is source-coupled, as is the bulk of PMOS transistor M1.

The gate of transistor M1 receives control signal GMn[m]. The gate of transistor M2 receives control signal GNn[M].

In embodiments, during programming, the de-selected local word line is biased at 0V. More preferably, the de-selected word line can be biased with a negative voltage, such as −0.5 V or −1V, to reduce possible leakage current of de-selected cells with the shared bit line, i.e., LWL0[1:255] if LWL0[0] is selected for programming.

Exemplary operating conditions for this word line driver 10 when used with parallel flash for sector-by-sector erase, where the sectors do not share a common P-well (See FIG. 6), are shown in the table below. The table shows the bias conditions when (a) local word line LWL0[0] is read, (b) the local word line LWL0[0] is programmed, and (c) sector 0 is erased.

|  | Read | Program-1 | Program-2 | Sector Erase | Soft Program-1 | Soft Program-2 |
|---|---|---|---|---|---|---|
| MWL0[0] | 5 V | 8 V | 8 V | 0 V | VCC | VCC |
| MWL0[1:15] | 0 V | 0 V | −0.5 V | 0 V | VCC | VCC |
| MWLn[0:15] | VCC | VCC | VCC | VCC | VCC | VCC |
| GM0[0] | −2 V | −2 V | 8 V → 0 V | 0 V | VCC | VCC |
| GN0[0] | 0 V | 0 V | 8 V → 0 V | 0 V | VCC | VCC |
| GM0[1:15] | 5 V | 8 V | 8 V | 0 V | VCC | VCC |
| GN0[1:15] | 5 V | 8 V | 8 V | 0 V | VCC | VCC |
| GMn[0:15] | VCC | VCC | VCC | VCC | VCC | VCC |
| GNn[0:15] | VCC | VCC | VCC | VCC | VCC | VCC |

-continued

|  | Read | Program-1 | Program-2 | Sector Erase | Soft Program-1 | Soft Program-2 |
|---|---|---|---|---|---|---|
| VNEG[0] | 0 V | 0 V | −0.5 V | −7.5 V | −0.5 V | 0 V |
| VNEG[n] | 0 V | 0 V | 0 V | 0 V | 0 V | 0 V |
| LWL0[0] | 5 V | 8 V | 8 V | −7.5 V | −0.5 V | 0 V |
| LWL0[1:15] | 0 V | 0 V | −0.5 V | −7.5 V | −0.5 V | 0 V |
| LWL0[16:255] | 0 V | 0 V | −0.5 V | −7.5 V | −0.5 V | 0 V |
| LWLn[0:255] | 0 V | 0 V | 0 V | 0 V | 0 V | 0 V |

The following table shows operating conditions for both parallel flash (FIG. 6) and serial flash (FIG. 7). Specifically, the "block erase" conditions can be used to block erasing in serial flash or sector erasing in parallel flash. The "sector erase" conditions of the following table can be used for sector erasing in serial flash.

|  | Read | Prog. 1 | Prog. 2 | Block Erase | Sector Erase | Soft Prog. 1 | Soft Prog. 2 |
|---|---|---|---|---|---|---|---|
| MWL0[0] | 5 V | 8 V | 8 V | −7.5 V | −7.5 V | VCC | VCC |
| MWL0[1:15] | 0 V | 0 V | −0.5 V | −7.5 V | 2.5 V | VCC | VCC |
| MWLn[0:15] | VCC | VCC | VCC | VCC | VCC | VCC | VCC |
| GM0[0] | −2 V | −2 V | 8 V → 0 V | −10 V | −10 V | VCC | VCC |
| GN0[0] | 0 V | 0 V | 8 V → 0 V | −10 V | −10 V | VCC | VCC |
| GM0[1:15] | 5 V | 8 V | 8 V | −10 V | −10 V | VCC | VCC |
| GN0[1:15] | 5 V | 8 V | 8 V | −10 V | −10 V | VCC | VCC |
| GMn[0:15] | VCC | VCC | VCC | VCC | VCC | VCC | VCC |
| GNn[0:15] | VCC | VCC | VCC | VCC | VCC | VCC | VCC |
| VNEG[0] | 0 V | 0 V | −0.5 V | −7.5 V | −7.5 V | −0.5 V | 0 V |
| VNEG[n] | 0 V | 0 V | 0 V | 0 V | 0 V | 0 V | 0 V |
| LWL0[0] | 5 V | 8 V | 8 V | −7.5 V | −75 V | −0.5 V | 0 V |
| LWL0[1:15] | 0 V | 0 V | −0.5 V | −7.5 V | −7.5 V | −0.5 V | 0 V |
| LWL0[16:255] | 0 V | 0 V | −0.5 V | −7.5 V | 2.5 V | −0.5 V | 0 V |
| LWLn[0:255] | 0 V | 0 V | 0 V | 0 V | 0 V | 0 V | 0 V |

The two foregoing tables show two alternative programming conditions, designated Program-1 and Program-2. Soft program conditions are also shown. During programming of local word line LWL0[0], the de-selected word lines (LWL0 [1:255] and LWLn[0:255]) are biased at ground (0V) (Program-1 condition). In Program 2 conditions, local word line LWL0[1:255] of the selected sector 0 are biased at a negative voltage, such as −0.5V or −1.0V, to reduce the possible cell leakage current on the de-selected cell with the shared bit line. For GM0[0] and GN0[0], "8V→0V" means 8V is applied initially to pass −0.5V to all word lines controlled by GM0[0] and GN0[0]. Then, 0V is applied to pass 8V to the selected word line. These conditions assume the NMOS threshold voltage Vth>0.5V.

In the table above, the block erase of the serial flash is the same as the sector erase of the serial flash except for the biasing of the main word lines MWL0[1:15] associated with local word lines LWL0[16:255]. During sector erasing of the serial flash, the de-selected sector can have a positive voltage on its word lines, such as 2.5 V, to reduce erase disturbance. The P-well of the NOR cells will be biased between 6V and 8V generally. The positive word line bias reduces the voltage drop from the P-well to the de-selected word lines, thereby reducing erase disturbance.

Those in the art will understand that soft programming is used after erasing to correct the over-erased cells, i.e., cells where the threshold voltage is too low, for example, below 1V, to have a higher threshold. During soft program, the word line voltage is set to 0V or a negative voltage such as −0.5V or −1.0 V rather than 8.0 V. Soft programming is also known in the art as over-erase correction.

NMOS transistor M2 preferably is a triple well NMOS transistor, since a negative voltage is applied as signal VNEG during erase and when using the biasing conditions of Program-2 and Soft Program-1. The NMOS bulk must be biased at the most negative voltage. If a normal NMOS is used, the bulk is at VSS and is p-type. When a negative voltage is input to the word line, the p-n junction on the bulk to n+ source/drain would be turned on. Turn-on is avoided using a triple well NMOS.

FIG. 5 is circuit diagram of an alternative embodiment of a word line driver 10A for biasing local word lines in the parallel or serial flash arrays of FIGS. 6 and 7. The word line driver for each local word line (LWLn[m]) comprises, and preferably consists of, two NMOS transistors M3 and M4 coupled between the respective main word line (MWLn[m]) and a terminal designated VNEG[n].

Exemplary bias conditions for the embodiment of FIG. 5 are shown in the table below for both serial and parallel flash memory arrays using this dual NMOS word line driver 10A embodiment. Specifically, the "block erase" conditions can be used to block erasing in serial flash or sector erasing in parallel flash. The "sector" erase conditions of the following table can be used for sector erasing in serial flash. This embodiment sets the de-selected local word lines (LWL0[1: 255] and LWLn[0:255]) to either 0V or a negative voltage (e.g., −0.5 V or −1.0V) during programming operation.

|  | Read | Prog. 1 | Prog. 2 | Block Erase | Sector Erase | Soft Prog.-1 | Soft Prog.-2 |
|---|---|---|---|---|---|---|---|
| MWL0[0] | 5 V | 8 V | 8 V | −7.5 V | −7.5 V | −0.5 V | 0 V |
| MWL0[1:15] | 0 V | 0 V | −0.5 V | −7.5 V | 2.5 V | −0.5 V | 0 V |
| MWLn[0:15] | VCC | VCC | VCC | VCC | VCC | VCC | VCC |
| GM0[0] | 8 V | 10.5 V | 10.5 V | 5 V | 5 V | 0 V | 0 V |
| GN0[0] | 0 V | 0 V | −0.5 V | −7.5 V | −7.5 V | 8 V | 8 V |
| GM0[1:15] | 0 V | 0 V | 0 V | 5 V | 5 V | 0 V | 0 V |
| GN0[1:15] | 5 V | 8 V | 8 V | −7.5 V | −7.5 V | 8 V | 8 V |
| GMn[0:15] | VCC | VCC | VCC | VCC | VCC | VCC | VCC |
| GNn[0:15] | VCC | VCC | VCC | VCC | VCC | VCC | VCC |
| VNEG[0] | 0 V | 0 V | −0.5 V | −7.5 V | −7.5 V | −0.5 V | 0 V |
| VNEG[n] | 0 V | 0 V | 0 V | 0 V | 0 V | 0 V | 0 V |
| LWL0[0] | 5 V | 8 V | 8 V | −7.5 V | −7.5 V | −0.5 V | 0 V |
| LWL0[1:15] | 0 V | 0 V | −0.5 V | −7.5 V | −7.5 V | −0.5 V | 0 V |
| LWL0[16:255] | 0 V | 0 V | −0.5 V | −7.5 V | 2.5 V | −0.5 V | 0 V |
| LWLn[0:255] | 0 V | 0 V | 0 V | 0 V | 0 V | 0 V | 0 V |

Figure 9:
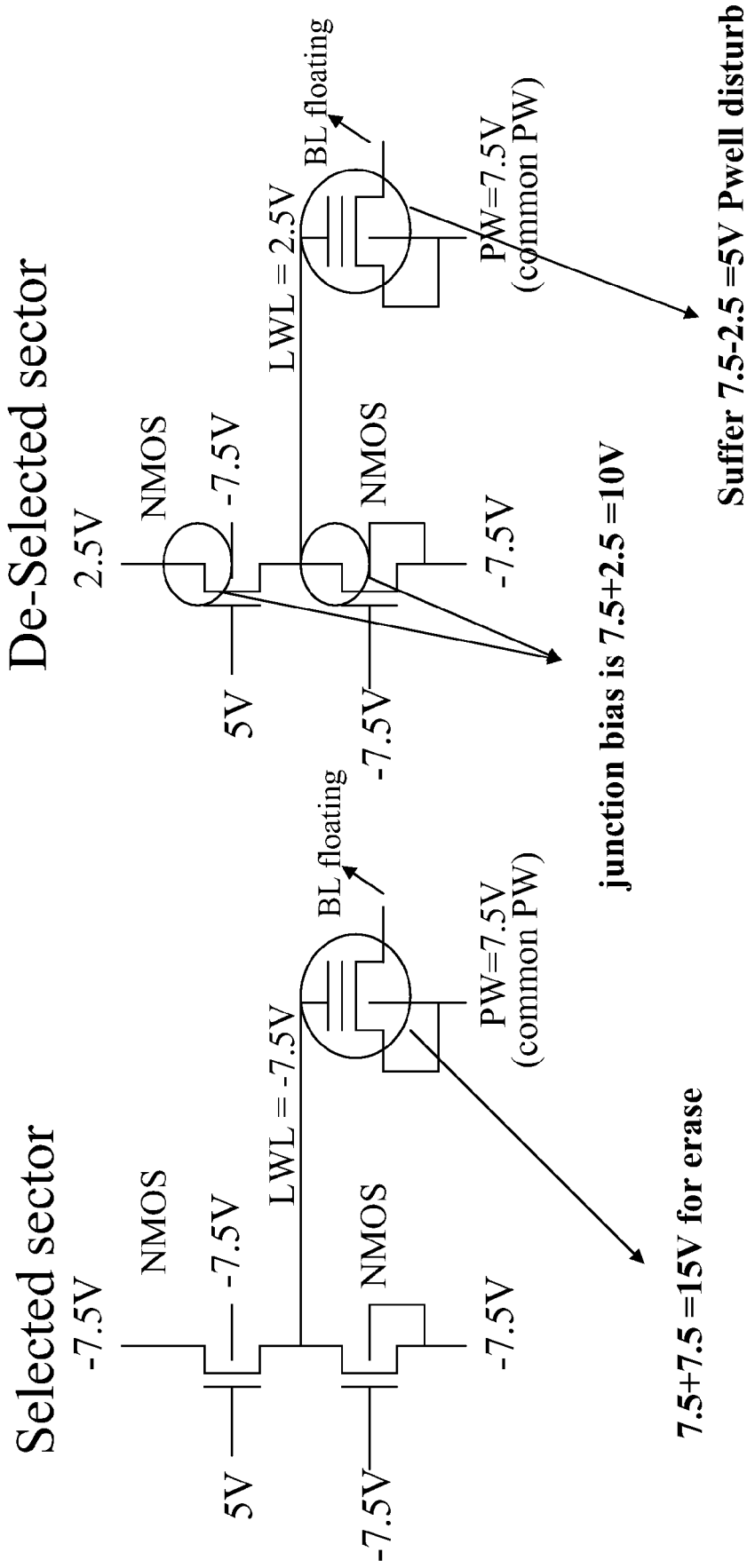
FIG. 9 illustrates various bias conditions in the two-transistor word line driver design of FIG. 4 and memory cells coupled thereto in a serial flash during erasing.

As shown in FIG. 9, performing sector-by-sector erasing (as opposed to block-by-block erasing) in serial flash results in a 10V junction bias as well as a 5V P-well disturb for the deselected sector if the flash cells need 15V to perform erasure. The voltage of the local word line of the deselected sector is a tradeoff between junction bias and P-well disturb. If cells need less voltage to erase, junction bias a P-well disturb will reduce. If this is a concern, the higher coupling factor of the control gate to the floating gate of the flash cells and the thinner thickness of the tunnel oxide would reduce the erase voltage level. This applies for both word line driver 10 and word line driver 10A.

The use of two transistors in each word line driver saves large amounts of area verses prior art three or more transistor designs. In embodiments where two NMOS transistors are used, there are penalties, but these penalties are outweighed by the area savings. For example, during programming, the NMOS gate must be biased at a voltage value GM0[0] (e.g., 10.5V) that is larger than main word line voltage MWL0[0] (e.g., 8V) so that the full main word line voltage level can be passed to the local word lines. The NMOS transistor M3 has a threshold voltage, Vth. The local word line LWL0[0] will be biased at a maximum level of GM0[0] minus Vth, depending on the voltage level of the main word line. If the main word line voltage is less than this maximum number, the full voltage can pass to the local word line. Therefore, GM0[0] should be at least Vth+MWL0[0] (i.e., the voltage level of the main word line). This is not an issue if a PMOS transistor is selected to pass the voltage. The PMOS gate is biased at GM0[0] that is a negative voltage (e.g., −2V) or ground so as to fully pass the main word line voltage. In the dual NMOS embodiment, a separate voltage circuit is used to provide a voltage that exceeds the main word line voltage, but this signal is a global signal and any area consumed by this high voltage circuit is much smaller than the area consumed by the use of third transistor or other transistors in each local word line driver of the prior art. Various designs for circuits for providing this high voltage are known per se to those in the art and need not be detailed herein. By way of example, like other voltages that are higher than VCC, this voltage can be generated by pump and regulator circuits. Though not by way of limitation, examples of charge pump circuits are described in U.S. Pat. No. 5,793,679 to Caser et al. and U.S. Publication No. 2005/0207236 A1 to Yamazoe et al.

It should apparent to those in the art that the word line driver design described herein is incorporated into an integrated circuit having the NOR cell memory array and other circuit components, including control logic, address decoder circuitry such as row and column decoders, and other circuit components or modules familiar to those in the art.

Exemplary applications for the flash memory described herein incorporating the exemplary word line driver include, but are not limited to, digital audio players, digital cameras, mobile telephones, USB flash drives (thumb drives), SPI serial flash and gaming memory cards.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A memory device of the non-volatile type comprising:
a memory array having a plurality of memory cells organized as sectors, each sector having a main word line associated with a plurality of local word lines, each local word line being coupled to the main word line by a respective two-transistor-only local word line driver circuit, each of the two-transistor-only local word line driver circuits having a first MOS transistor coupled between the respective main word line and a respective local word line and a second MOS transistor coupled between the respective local word line and a first biasing terminal;
wherein during a programming operation of a selected sector the first biasing terminal is set at a negative voltage;
wherein during the programming operation of the selected sector the transistors of the two-transistor-only local word line driver circuits of the selected sector are biased such that de-selected local word lines from the selected sector are biased at said negative voltage; and
wherein the transistors are biased such that during an erase operation, local word lines of a non-selected sector are biased at a positive voltage.

2. The memory device of claim 1, wherein the first biasing terminal is common to the two-transistor-only local word line drivers in each of the sectors.

3. The memory device of claim 1, wherein the second MOS transistor is an NMOS transistor.

4. The memory device of claim 3, wherein the NMOS transistor is a triple-well transistor.

5. The memory device of claim 3, wherein the first MOS transistors is a PMOS transistor.

6. The memory device of claim 3, wherein the first MOS transistor is an NMOS transistor.

7. The memory device of claim 6, wherein the NMOS transistors are triple-well transistors.

8. The memory device of claim 1, wherein the first biasing terminal is set to a ground potential during an erase operation.

9. The memory device of claim 1, wherein the memory device is a SPI serial flash memory device.

10. The memory device of claim 1, wherein a body terminal of the second MOS transistor is electrically coupled to the first biasing terminal.

11. The memory device of claim 1, wherein the memory array is a serial flash array of NOR type memory cells organized in a plurality of blocks and each block comprises a plurality of the sectors.

12. A two-transistor-only word line driver circuit for a hierarchical memory comprising:

only two MOS transistors, a first MOS transistor of the only two MOS transistors coupling a main word line to a one local word line of a plurality of local word lines, the first MOS transistor being selectively biased to pass a first voltage from the main word line to the one local word line, and a second MOS transistor of the only two MOS transistors coupling the one local word line to a biasing terminal, the second MOS transistor being selectively biased to pass a second voltage from the biasing terminal to the one local word line;

wherein during a programming operation the biasing terminal is set at a negative voltage;

wherein during the programming operation of a selected sector the transistors of the two-transistor-only word line driver circuits of the selected sector are biased such that de-selected local word lines from the selected sector are biased at said negative voltage; and wherein the transistors are biased such that during an erase operation, local word lines of a non-selected sector are biased at a positive voltage.

13. The two-transistor-only word line driver circuit of claim 12, wherein the first and second MOS transistors are NMOS transistors.

14. The two-transistor-only word line driver circuit of claim 13, wherein the NMOS transistors are triple-well transistors.

15. The two-transistor-only word line driver circuit of claim 14, wherein the biasing terminal is set to a ground potential during an erase operation.

16. The two-transistor-only word line driver circuit of claim 12, wherein the first MOS transistor is a PMOS transistor and the second MOS transistor is an NMOS transistor.

17. The two-transistor-only word line driver circuit of claim 12, wherein a body terminal of the second MOS transistor is electrically coupled to the biasing terminal.

* * * * *